United States Patent
Czech et al.

(10) Patent No.: US 12,072,720 B2
(45) Date of Patent: Aug. 27, 2024

(54) METHOD FOR MONITORING AND CONTROLLING A CURRENT DISTRIBUTION IN AN INSTALLATION

(71) Applicant: Siemens Aktiengesellschaft, Munich (DE)

(72) Inventors: Silvan Czech, Erlangen (DE); Markus Kogard, Hagenbrunn (AT); Wolfgang Paul, Maria Enzersdorf (AT); Harald Schweigert, Vienna (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/939,171

(22) Filed: Sep. 7, 2022

(65) Prior Publication Data

US 2023/0070162 A1  Mar. 9, 2023

(30) Foreign Application Priority Data

Sep. 8, 2021 (EP) .................................. 21195609

(51) Int. Cl.
*G05F 1/10* (2006.01)
*G01R 19/25* (2006.01)
*H02H 7/20* (2006.01)

(52) U.S. Cl.
CPC ........... *G05F 1/10* (2013.01); *G01R 19/2513* (2013.01); *H02H 7/20* (2013.01)

(58) Field of Classification Search
None
See application file for complete search history.

(56) References Cited

U.S. PATENT DOCUMENTS 6,522,110 B1 * 2/2003 Ivanov .................... G05F 1/577
307/41
11,217,988 B2 * 1/2022 Ishino .................. H02H 7/1213
(Continued)

FOREIGN PATENT DOCUMENTS

WO  2010018018  2/2010
WO  2019162750  8/2019

OTHER PUBLICATIONS

EP Search Report dated Feb. 18, 2022 based on EP21195609 filed Sep. 8, 2021.

*Primary Examiner* — Thomas J. Hiltunen
(74) *Attorney, Agent, or Firm* — Cozen O'Connor

(57) ABSTRACT

Method for monitoring and controlling current distribution in load circuits of an installation control system of a technical installation, wherein a predetermined and constant output voltage is provided by a clocked power supply and distributed to the load circuits, where load circuits are protected by a switch actuated by a controller, a variation of the current in each load circuit is measured during a learning phase, a significant current profile with an associated tolerance range is derived and associated with the respective load circuit from the measured current variation which is continuously monitored by the control unit and a check is performed to determine whether a power capacity limit is reached by the clocked power supply while operate the installation, and the current consumed load circuits is reduced and/or switched off by actuating switches in load circuits in which a current variation exceeds an upper limit of the tolerance range.

16 Claims, 1 Drawing Sheet

(56) References Cited

U.S. PATENT DOCUMENTS

| | | | | |
|---|---|---|---|---|
| 11,592,895 B1* | 2/2023 | Pineda | .................. | G06F 1/3296 |
| 2005/0289373 A1* | 12/2005 | Chapuis | .................... | H02J 1/08 |
| | | | | 713/300 |
| 2021/0249949 A1* | 8/2021 | Leroy | ..................... | H02M 1/40 |
| 2023/0030964 A1* | 2/2023 | Horinouchi | ............. | B60R 16/03 |
| 2023/0266782 A1* | 8/2023 | Dibbad | .................... | G06F 1/30 |
| | | | | 327/540 |

* cited by examiner

METHOD FOR MONITORING AND CONTROLLING A CURRENT DISTRIBUTION IN AN INSTALLATION

BACKGROUND OF THE INVENTION

1. Field of the Invention

The present invention generally relates to the field of electrical engineering, particularly to the field of power electronics and power electronics circuits and, more particularly, to a method for monitoring and controlling a current distribution in load circuits of an installation control system of a technical installation, where the load circuits therein have at least one load unit (for example, a sensor, actuator, relay, contactor, magnetic valve, servomotor, control system, and/or display unit), where a usually predetermined and constant output voltage is made available by at least one clocked power supply unit and is distributed for an energy supply of the load units to the load circuits of the installation control system, and where at least a plurality of the load circuits are additionally protected by a switch unit that is actuated by a control unit.

2. Description of the Related Art

In many fields nowadays, especially in industrial production and manufacturing, in automation technology, etc., complex technical installations and machines are put into use. An installation should be understood to be a well-planned assembly of components, for example, machines, devices and/or apparatuses that are in a spatial relation to one another and are linked to one another functionally or with respect to control technology and/or safety technology. For an efficient operation of technical installations, typically installation control systems are utilized via which an ongoing operation of the installation is to occur as autonomously and independently of human intervention as possible. Technical installations, such as production installations and/or processing installations, are very seldom identically constructed due to different requirements. Consequently, each installation or the respective associated installation control system therefore comprises different numbers and different sizes of consumers and/or load units, such as actuators, relays, contactors, magnetic values, servomotors, acoustic and/or optical warning signals and/or sensors, and control systems (for example, programmable logic controllers (PLCs), PC-based control systems and/or microcontrollers), for example, for an evaluation of sensor values and/or the actuation of actuators etc., and display units.

Typically, in technical installations, a plurality of electrical load units of the installation control system are grouped together into supply sectors and/or load circuits, where a load circuit has at least one load unit (for example, sensors, actuators, control system and/or display units). For the energy supply of the load units connected into load circuits, typically at least one clocked power supply unit (for example, switched mode power supply) is used. By way of the clocked power supply unit, a non-stabilized input voltage (usually an alternating voltage) is converted into a constant output voltage with an usually pre-determined value (for example, 24 V DC). The output voltage made available by the clocked power supply unit and/or the output current is then distributed to the respective power circuits of the installation control system of the technical installation, where the individual load circuits and/or the respective load units connected can have different power requirements.

Faults in load units, however, can have retroactive effects on the power supply unit. Thus, for example, an overload, a short-circuit or a short-circuit-like overcurrent, such as occurs on starting up motors due to a high-power requirement, can initiate a switching-off of the power supply unit in a load circuit. In order to prevent a total failure of the installation due to, for example, a switch-off of the power supply unit, the load circuits are usually protected on the output side of the power supply unit against overloads or short-circuits with protection equipment, such as circuit breakers and/or automatic circuit breakers with particular tripping characteristics. With these methods, it is ensured that an overloaded load circuit is switched off and that the remaining load circuits of the installation and/or installation control system remain unaffected thereby. However, protection equipment in particular, such as circuit breakers, although they are economic, have wide tolerances in their tripping accuracy. In the event of a fault, delays in tripping can therefore occur (for example a few milliseconds).

Nowadays, therefore, for the protection of clocked power supply units against retroactive effects from load circuits (for example, defective load unit, short-circuit, short-circuit-like overcurrent and/or overload), electronic circuit breakers are used ever more often. Circuit breakers of this type have an electronic switch unit (for example, a semiconductor switch) that is actuated by corresponding control signals from a control unit. Such circuit breakers can act rapidly in the event of a fault and, according to the tripping parameters (for example, tripping current and/or maximum permissible duration of an overcurrent) that can be set via the control unit, can limit and/or switch off a current in the corresponding load circuit if an instance of exceeding one of the settable tripping parameters is detected.

A dimensioning of the protection of individual load circuits and/or the load units connected thereto is usually specified in a project planning phase for an installation, set during a realization phase for the installation and can still be adapted during a first commissioning of the installation, where primarily circuit breakers that are dimensioned or set too low are adjusted. Often however, for time reasons, the tripping parameters of the circuit breakers of the individual load circuits are not suitably selected. That is, for example, tripping parameters are set higher for the circuit breaker and/or the switch unit than would be necessary for the respective load circuit and/or the respective at least one connected load unit.

A selective tripping of individual circuit breakers and/or switch units is thereby no longer assured because, in the event of a fault (for example, short circuit and/or overload), the (excessively dimensioned) switch unit of the control unit arranged directly before the affected load circuit is no longer actuated at the right time in order to limit and/or interrupt the current. The current can thus flow in the relevant load circuit and thus into the at least one load unit of the load circuit and there can possibly lead to relatively severe damage. If relevant, a preliminary protection (for example, circuit breaker) trips after a delay, so that relatively large installation sections are unnecessarily deenergized. In the worst case, due to the overload or short-circuit current, the power capacity of the power supply unit can be exceeded, so that the entire installation fails because the power supply unit feeding it is overloaded by the unexpected additional power requirements.

WO 2010/018018 A1 discloses a method in which within an observation period, for a consumer and/or a load unit in a technical installation, the highest tripping current value necessary for the ongoing operation is ascertained in order to adjust it in a settable circuit breaker. For this purpose, the current consumed by the consumer is measured by a control unit during a plurality of observation time intervals. For each observation interval, a maximum value of the measured current is determined and stored. From the measured maximum values, which are provided with a safety reserve, starting from a default value (for example, nominal current), for example, via gradual averaging starting from a default value (for example, nominal current) a static limit value is then determined for adjusting the tripping parameter and/or tripping current. Therein, in addition to the static limit value for the ongoing operation, a dynamic limit value for switch-on processes of the consumer are also ascertained.

However, a total of the set and/or ascertained values of the tripping parameters, in particular the tripping current, at which the individual circuit breakers and/or switch units for protecting the load circuits trigger is not seldom significantly higher than a power capacity of the supplying power supply unit, particularly if, for example, during operation of the installation, a plurality of load units (magnetic values, servomotors and./or contactor coils) are switched on simultaneously by usually a plurality of load circuits. In the method disclosed in WO 2010/018018 A1, the tripping parameters, in particular the value of the tripping current of the individual circuit breakers for protecting the individual consumers, are adjusted to the operating conditions of the installation. However, the power capacity of the power supply unit when supplying a plurality of connected consumers and/or load circuits and a distribution of the output current to the individual consumers and/or load circuits is hardly taken into account therein. Furthermore, erroneous switching off of load circuits or load units can also occur because only the current consumption of the individual load circuits and/or the connected load units is decisive for determining at which prevailing current value the switch unit of the protection equipment trips. That is, a current consumed by a load circuit is, for example, limited or switched off although the power supply unit still has sufficient power capacity for the supply thereof, or because based on historical maximum values in the observation period, too low a tripping value has been ascertained. This leads, for example, to unnecessary switching off of at least parts of the installation.

SUMMARY OF THE INVENTION

In view of the foregoing, it is therefore an object of the invention to provide a method that is further developed in relation to the prior art which, during ongoing operation of a technical installation, enables a functioning of the installation that is safe and as fault-free as possible, in particular, of load circuits of an installation control system and a power supply unit supplying the load circuits of the installation control system, in a simple manner and with little effort for project planning of the installation.

This and other objects and advantages are achieved in accordance with the invention by a method for checking and controlling a current distribution in load circuits of an installation control system of a technical installation, during a learning phase, at least in those load circuits that are protected by a switch unit, a current variation of the current consumed by each load circuit is measured. From the current variation measured for the respective load circuit, at least a significant current profile and a tolerance range associated with the current profile are derived and associated with the respective load circuit. During the ongoing operation of the installation, a current variation that is measured for at least those load circuits that are protected with a switch unit is continuously monitored by the control unit. Furthermore, the control unit checks whether a power capacity limit is at least reached or exceeded by the clocked power supply unit. If the power capacity limit is at least reached or exceeded by the clocked power supply unit, then the current consumed by each load circuit is at least reduced and/or switched off by the control unit by actuating the switch unit in those load circuits in which an upper limit of the tolerance range of the significant current profile associated with the respective load circuit is exceeded by the current variation presently being measured for the respective load circuit.

The main aspect of the proposed solution in accordance with the invention lies in, for the load circuits of the installation control system, as much current and/or energy being supplied as is needed by each load circuit and/or by the at least one load unit belonging to each load circuit at a current time point during ongoing operation, provided the clocked power supply unit does not reach and/or exceed its power capacity limit. If this power capacity limit is at least reached or exceeded, then via corresponding actuation of the switch units, the current is then reduced and/or switched off in those load circuits that consume current beyond a normal or typical level and/or that show a "remarkable" current behavior. The normal and/or typical level of power requirement of each load circuit is determined with the associated tolerance range based on the current profile ascertained in the learning phase for each load circuit. It is therefore no longer necessary, for the load circuits of the installation that are protected with a switch unit, to determine suitable tripping values for the protecting switch units in each load circuit in which the current is reduced and/or switched off. Rather, as a limiting factor, the power capacity of the power supply unit providing the supply is taken into account. In this way, ideally faulty settings in the planning or installing of the installation, in particular tripping values of switch units acting as electronic circuit breakers being set too high are prevented. Furthermore, the static and dynamic current behavior of the load circuits in combination and a distribution of an output current of the power supply unit to the individual load circuits and their load units are taken into account.

It is favorable if, in order to recognize when the power capacity limit of the clocked power supply unit is reached, the output voltage of the clocked power supply unit or a sum of prevailing current measurement values of the respective currents consumed by the load circuits is monitored by the control unit. In the simplest case, the output voltage of the clocked power supply unit, i.e., the supply voltage, is used as a criterion by the control unit. It is thereby monitored whether the output voltage of the clocked power supply unit reaches or exceeds a predetermined limit value (for example 20 V). Optionally, given a known characteristic of the power supply unit, a plurality of voltage limit values can also be predetermined, which correspond to a respective prevailing information item regarding the overload state of the power supply unit. The voltage limit values can be evaluated progressively and/or compared with the prevailing output voltage of the power supply unit and a prevailing level of the respective overload and corresponding measures (for example, reduction and/or switching-off of the current in individual load circuits, in a plurality of load circuits, etc.) can be derived therefrom.

Alternatively, the control unit can also calculate a prevailing sum value from prevailing current values of the current consumed by the load circuits and use this sum value as a criterion. It is therein checked by the control unit whether the respective sum value reaches and/or exceeds a predetermined limit value. The predetermined limit values for the output voltage and/or for the prevailing sum value of the prevailing currents consumed in the load circuits ideally result from an overload capability of the power supply unit.

Ideally a timespan can be predetermined during which the power capacity limit of the clocked power supply unit can be exceeded by a predetermined amount. That is, the power supply unit can make a predeterminable overcurrent, which goes beyond a normally supplied continuous current, available for a short predeterminable duration (for example, 5 ms) as the output current. This overload capacity can be used to cover dynamic current behavior processes in the installation (for example, parallel switching-on of a plurality of load circuits, etc.).

In an embodiment, in order to recognize the reaching of the power capacity limit of the clocked power supply unit, prevailing capacity utilization values or a reaching and/or exceeding of the power limit are continuously transferred from the clocked power supply unit to the control unit. The power supply unit can capture, for example, an internal thermal situation (for example, temperature and/or degree of heating), and/or input voltage variations (for example, voltage peaks, network disturbances and/or phase dropout), and therefrom, for example, from a prevailing situation, calculate dependent parameters which reproduce the prevailing power capacity of the clocked power supply unit. These parameters are passed on as prevailing capacity utilization values to the control unit and can be utilized thereby to monitor the power capacity limit of the power supply unit. Thereby, in an advantageous manner, a prevailing situation of the power supply unit, such as heating and/or faults in the input voltage, can also be taken into account. Furthermore, based on the prevailing capacity utilization values, it is possible to calculated in advance when the output voltage must be regulated down by the power supply unit, for example, for the purpose of self-protection and/or when the power capacity limit will at least be reached.

Ideally, a sequence is prescribed to the control unit for a reduction and/or a switching-off of the current in those load circuits, in which the upper limit of the tolerance range of the significant current profile associated with the respective load circuit is exceeded. Therein, it can be specified, for example, that firstly the consumed current is reduced and/or switched off in those load circuits by which, for example, the power supply unit is loaded the most strongly and/or which consume the most current. A load relief of the power supply unit can thus be provided for in a simple and rapid manner.

Furthermore, in an advantageous manner, a status marking is assigned by the control unit to those load circuits in which, during ongoing operation of the installation, the upper limit of the tolerance range of the significant current profile associated with the respective load circuit is exceeded by the prevailing current variation measured for the respective load circuit. Thereby, in a simple manner, tolerance-exceeding load circuits are identified which consume current going beyond the usual level during ongoing operation of the installation. If, for example, a power requirement of a load circuit, i.e., the presently measured current variation of this load circuit, again falls within the tolerance range of the significant current profile associated with the respective load circuit, then it can be provided that the status marking of this load circuit is, for example, restored again.

It is therefore favorable if, on reaching and/or exceeding the power capacity limit of the clocked power supply unit, the status marking that is currently assigned to the respective load circuit is used by the control unit. Thereby, on occurrence of a supply bottleneck or a supply emergency, those load circuits in which a current reduction and/or switch-off is to be performed can be identified quickly and easily.

Furthermore, based on the current variations of the load circuits presently being measured during the ongoing operation of the installation monitored by the control unit, ideally an alarm message can be output for those load circuits in which the upper limit of the tolerance range of the significant current profile associated with the respective load circuit is exceeded, during ongoing operation of the installation, by the current variation presently being measured for the respective load circuit. This alarm message can, for example, be recorded or passed on to an operator of the installation and ideally provides information regarding a "remarkable" current behavior in a load circuit of the installation. Furthermore, the alarm messages can be weighted, for example, according to system endangerment. For this purpose, it can be evaluated, for example, whether in a load circuit the tolerance range of the associated significant current profile is exceeded by the respective consumed current only slightly and/or briefly or whether a greater and/or longer-lasting exceeding of the tolerance range of the respective current profile has occurred.

In a further embodiment of the invention, for the reduction of the current consumed by the respective load circuit, the switch unit of the respective load circuit is actuated by the control unit such that the current consumed by the respective load circuit is time-limited. That is, in the case of a supply bottleneck or a supply emergency, the switch unit protecting the respective load circuit is actuated in a linear manner to keep the current in the respective load circuit to a predetermined value regardless of the behavior of the at least one load unit and/or a nominal load arranged in the load circuit. Alternatively, for the reduction of the current consumed by the respective load circuit, the switch unit of the respective load circuit can also be actuated by the control unit such that the switch unit is switched into a clocked operation. That is, in this case, the switch unit is controlled in a pulsed manner by the control unit to keep the current in the respective load circuits at a predetermined value. In the simplest case, the current consumed by the respective load circuit is switched off completely, for example, after a predetermined time, where the switch unit protecting the load circuit is actuated accordingly.

It is further favorable if the significant current profile of the respective load circuit is derived in the learning phase based on preset data from the current variation measured for the respective load circuit. This preset data ideally, typically and characteristically, comprises current patterns of load units often used in load circuits. Such current patterns are, for individual load units, for example, characteristic shapes of the current. The preset data can comprise the following exemplary current patterns: a purely ohmic profile which is typical for simple sensors and/or heating elements; a capacitive current-limited profile with a current peak which decays according to an exponential function and that can be typical of, for example, sensor units; and/or an inductive-ohmic profile, for example, with a dip, which is typical of magnetic valves and/or protectors; a profile with a current rise followed by a waiting period and a renewed current rise which, for example, control systems typically have when running up. The characteristic current patterns are ascertained, for example, based on historical current patterns, for example, on a dedicated computer unit (for example, a PC) and are specified to the control unit as preset data, for example, before the learning phase, ideally before a first commissioning of the installation, in order to derive the significant current profiles of the load circuits of the installation control system more rapidly.

Ideally, a trained neural network is used for a derivation of the significant current profile of the respective load circuit. With the use of a trained neural network, the derivation of the respective significant current profile of the load circuits of the installation can be significantly accelerated. A training of the neural network can occur, for example, on a dedicated computer unit, for example a PC, using training data, such as typical and characteristic current patterns of load units, often used in load circuits. With the training, the neural network receives a collection of weighted decision criteria that enable it to decide rapidly between different current patterns and rapidly to recognize recurring current patterns in measured current patterns of load circuits. The trained neural network is transferred, for example, following corresponding training and before the learning phase, ideally before the first commissioning of the installation, to the control unit and there, in the learning phase, can significantly accelerate the detection of the current profiles that are significant for the respective load circuits and the determination of the respectively assigned tolerance ranges, i.e., recurring current variations in the current size, duration and shape in the respective current patterns, including the respective variation regions.

In a preferred embodiment of the invention, for the learning phase in which, from a current variation measured for a respective load circuit, a current profile that is significant for the respective load circuit is derived, a minimum duration is defined. The minimum duration of the learning phase ensures at least that for each load circuit, at least two typical repeating current patterns have been found in the current variation measured for the respective load circuit, so that based on the at least two typical, repeating current patterns, a significant current profile and an at least rough tolerance range can be set for this current profile.

In the maximum case, the learning phase can comprise the whole lifespan of the installation. That is, during ongoing operation, the current patterns measured for the load circuits are checked for typical current patterns in order to refine and improve continuously the associated significant current profile and the associated tolerance range of the respective load circuit. Furthermore, a change in a significant current profile (for example, in level, duration and/or shape) can represent an indicator for an aging or an impending functional fault of a load unit in the associated load circuit. Changes of this type can very easily be recognized by the control unit.

Thus, for example, the current variation measured for a load circuit affected during the operation of the installation can lastingly exceed or undershoot the tolerance range of the significant current profile associated with the load circuit. The load circuit affected can be notified to the operator of the installation, for example, via an alarm message. Before the alarm message, for example, another relevance check can be performed, where the deviations from the significant current profile and/or the exceeding or undershooting of the associated tolerance range is notified only given a predetermined minimum deviation from, for example, the current level and/or the shape of the significant current profile.

Furthermore, repeated deviations from the significant current profile and/or repeatedly exceeding or undershooting the associated tolerance range can lead to a corresponding adjustment of the significant current profile of a load circuit or of the associated tolerance range, provided predetermined criteria are met. A possible criterion is, for example, that the deviations from the current profile and/or repeated exceeding or undershooting of the associated tolerance range occur regularly or evenly. Thereby, it can be assumed, for example, that these correspond to a "normal" current variation in the affected load circuit. The adjustment of the significant current profile of the affected load circuit and/or of the associated tolerance range can occur, for example, automatically. However, it can also be provided that an operator of the installation must confirm such an adjustment. Before that, for example, the operator can ensure that no obvious defects or an unusual operating behavior have occurred in the affected load circuit.

At least a plurality of the load circuits of the installation control system are protected by a switch unit, which functions as electronic circuit breakers, for each load circuit protected with a switch unit Consequently, ideally a safety limit value is preset, on reaching and/or exceeding of which the current consumed by the respective load circuit is always switched off. This safety limit value, which should ideally lie above the upper limit of the tolerance range of the significant current profile associated with the respective load circuit, is a maximum value for the load circuit current. The safety limit value is set to meet fire protection conditions and, in the worst case, given a defective load unit in a load circuit, to prevent a fire.

It is further advantageous if, for example, to meet fire protection equipment conditions, an additional item of protection equipment is provided. Therein, for example, the further protection equipment (for example, circuit breaker and/or fusible cutout) is connected upstream of the switch unit that protects the respective load circuit, and is tripped in any event on failure of the switch unit. The protection equipment can additionally be selected, for example, so that only current levels or patterns are allowed through, in which the line and the at least one load unit in the load circuit are protected against damage and/or fire.

A favorable embodiment of the invention provides that a power transistor or a microelectromechanical system (MEMS) is used as the switch unit. Power transistors and a MEMS represent an electronic switch that can be actuated very easily by a control unit to limit a current. Furthermore, via corresponding actuation, the current can be very easily interrupted by a power transistor or a MEMS as a switch unit. MEMS are typically tiny semiconductor components that ideally combine logic elements and micromechanical structures (for example armatures which are moved by electrostatic forces) in one component.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWING

The invention will now be described in an exemplary manner on the basis of the attached figures, in which.

DETAILED DESCRIPTION OF THE EXEMPLARY EMBODIMENTS

Figure 1:
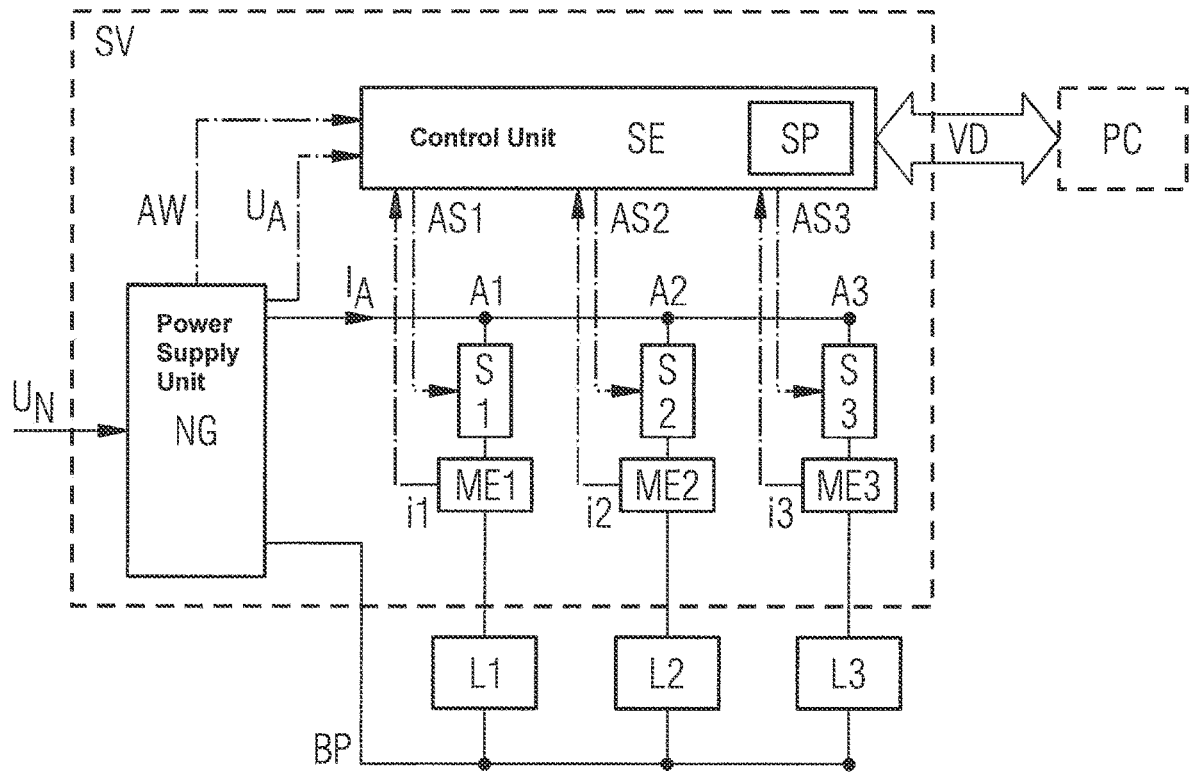
FIG. 1 shows a schematic and exemplary arrangement for implementing the method for monitoring and controlling a current distribution in load circuits in a technical installation in accordance with the invention.

FIG. 1 shows in a schematic manner an exemplary arrangement SV for a power supply of an installation control system in a technical installation. With the exemplary arrangement SV, a current distribution can be monitored and controlled in load circuits L1, L2, L3 of the installation control system. For this purpose, the arrangement SV has a clocked power supply unit NG, such as a switched mode power supply which is fed by a network voltage UN, for example, a DC voltage, a single-phase or three-phase alternating voltage. The clocked power supply unit NG is connected to a reference potential BP (for example, 0 V) and supplies an output voltage $U_A$ with a regulated and usually predetermined value (for example, 24 V) and an output current $I_A$. Furthermore, prevailing capacity utilization values AW can be continually transferred from the power supply unit NG, provided it is designed therefor, to a control unit SE.

Furthermore, at least one load circuit L1, L2, L3 is provided for the installation control system. Mostly, however, an installation control system has a plurality of load circuits L1, L2, L3. The individual load circuits L1, L2, L3 have at least one load unit, for example a sensor, actuator, relay, contactor, magnetic valve, servomotor, drive unit for a motor, servomotor, control system and/or display unit. The load circuits L1, L2, L3 are also connected on one side to the reference potential. On the other side, the load circuits L1, L2, L3 are connected for an energy supply to the load units via branches A1, A2, A3, to the clocked power supply unit NG. For this purpose, the output voltage $U_A$ made available by the power supply unit NG and/or the output current $I_A$ are distributed among the respective load circuits L1, L2, L3.

Furthermore, at least a plurality of the load circuits L1, L2, L3 are protected by a switch unit S1, S2, S3. That is, individual load circuits L1, L2, L3 that need a very small current and/or must almost always be supplied (for example, a load circuit L1, L2, L3 with a control system as the load unit) may have no switch unit S1, S2, S3 for protection. Ideally, all the load circuits L1, L2, L3 are protected by a switch unit S1, S2, S3, as shown by way of example in FIG. 1. The switch unit S1, S2, S3 functions as an electronic and settable circuit breaker for the respective load circuit L1, L2, L3. For this purpose, each switch unit S1, S2, S3 is actuated via corresponding control signals AS1, AS2, AS3 from a control unit SE. Thereby, a current consumed by each load circuit L1, L2, L3 and thus a distribution of the output current $I_A$ of the power supply unit NG to the load circuits L1, L2, L3 can be controlled accordingly. For example, a power transistor or a microelectromechanical system (MEMS) can be used as the switch unit S1, S2, S3. In addition, a further protection apparatus (for example, circuit breaker and/or fusible cutout) that is, for example, connected upstream of the respective switch unit S1, S2, S3 can be provided. For the sake of clarity, the additional protection apparatuses are not shown in FIG. 1.

Furthermore, a measuring unit ME1, ME2, ME3 is provided in a branch A1, A2, A3 of the respective load circuit L1, L2, L3. A prevailing current variation i1, i2, i3 of the current consumed by the respective load circuit L1, L2, L3 is measured by the measuring unit ME1, ME2, ME3 and is passed on to the control unit SE for a corresponding monitoring and evaluation.

As the control unit SE, via which the switch units S1, S2, S3 are actuated via control signals AS1, AS2, AS3 and which monitors the current variations i1, i2, i3 in the load circuits L1, L2, L3, for example a microprocessor can be used.

Furthermore, the control unit SE can have at least one storage unit SP in which, for example, limit values to be monitored for the output voltage $U_A$ of the power supply unit, limit values for a sum of the currents in the load circuits L1, L2, L3 and/or settable values for the switch units S1, S2, S3 are stored. Furthermore, a presettable safety limit value, for example, for each switch unit SE can be stored in the storage unit SP of the control unit SE. At this presettable safety limit value (for example, maximum permissible load circuit current), the current consumed by each load circuit L1, L2, L3 is in any event interrupted by the respective switch unit S1, S2, S3. Furthermore, preset data VD (for example, current patterns and/or decision criteria for a neural network) that is determined, for example, on an external computer unit and is needed in the execution of the method for monitoring and controlling the current distribution in the load circuits L1, L2, L3 can be stored in the storage unit SP.

In order to distribute the load units of the installation control system in load circuits L1, L2, L3, for example, the clocked power supply unit NG can itself have at least one or more outputs A1, A2, A3 to which the load circuits L1, L2, L3 are directly connected. Therein, each output A1, A2, A3 is then protected with a switch unit S1, S2, S3 and has a measuring unit ME1, ME2, ME3 for measuring the current variation i1, i2, i3 in a connected load circuit L1, L2, L3. Furthermore, the control unit SE is then integrated into the power supply unit NG. That is, the power supply unit comprises the units included by the dashed line in FIG. 1 and thus corresponds to the arrangement SV shown by way of example in FIG. 1.

Alternatively, at least one or more electronic circuit breaker modules, such as the selectivity modules SITOP SEL1200 or SITOP SEL1400 from Siemens, can be connected downstream of the clocked power supply unit NG. Then, the respective circuit breaker module has the outputs A1, A2, A3 to which the load circuits L1, L2, L3 are connected. Therein, the circuit breaker module comprises the switch units S1, S2, S3 for protecting the outputs A1, A2, A3 and/or the connected load circuits L1, L2, L3, the measuring units ME1, ME2, ME3 for measuring the current variation i1, i2, i3 in the connected load circuit L1, L2, L3, and the control unit SE.

If a plurality of circuit breaker modules are used, then the control unit SE can be subdivided, for example, into a plurality of functional units that are distributed among the respective circuit breaker modules. The circuit breaker modules and/or the at least one functional unit of the control unit SE arranged thereon are connected, for example, via a data bus, where one of the distributed functional units is a "master" functional unit for a higher-order control and/or monitoring of the load circuits L1, L2, L3 and the further distributed functional units function as "slave" functional units for a local and rapid control and/or monitoring of the load circuits L1, L2, L3 connected to the respective circuit breaker module. Furthermore, for the functional units of the control unit SE, a storage unit SP can be provided in each circuit breaker module, in which at least those values (for example, circuit breaker limit values) are stored that are locally necessary for a control and monitoring of the current in the respective load circuits L1, L2, L3 connected to each circuit breaker module.

Figure 2:
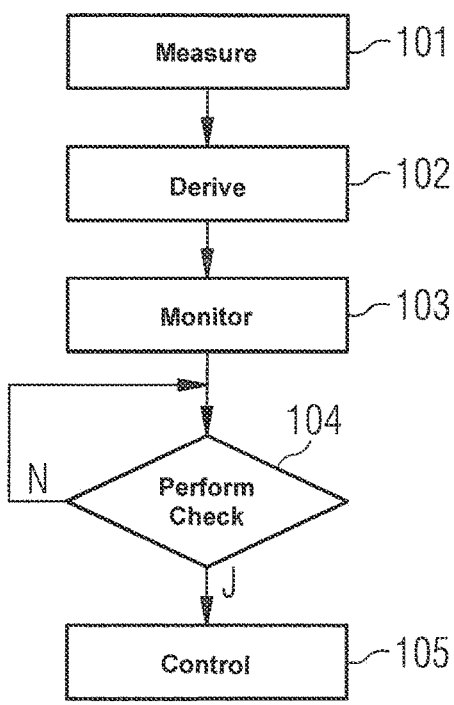
FIG. 2 shows an exemplary sequence of the method for monitoring and controlling a current distribution in load circuits in a technical installation in accordance with the invention.

FIG. 2 shows an exemplary sequence of the method in accordance with the invention for monitoring and controlling the current distribution in the load circuits L1, L2, L3 of an installation control system in a technical installation, as shown by way of example in FIG. 1.

In a learning phase that can be started, for example, with a first commissioning of the installation, in a measuring step 101 at least in each load circuit L1, L2, L3 protected with a switch unit S1, S2, S3, the current variation i1, i2, i3 of the current consumed by the respective load circuit L1, L2, L3 is measured. The measurement can be performed, for example, via the measuring unit ME1, ME2, ME3 provided for the respective load circuit. A current variation i1, i2, i3 measured for the respective load circuit L1, L2, L3 is then passed on to the control unit SE.

In a derivation step 102 that also belongs to the learning phase, a significant current profile with an associated tolerance range is derived from the current variation i1, i2, i3 measured for the respective load circuit L1, L2, L3. For this purpose, the current variation i1, i2, i3 measured for the respective load circuit L1, L2, L3 is searched through for a recurring, characteristic current pattern. A current pattern of this type represents a portion of the respectively measured current variation i1, i2, i3 that has approximately the same current level, duration and/or shape. In particular, the current patterns should contain the highest momentary current values.

From the recurring current pattern found for the respective load circuit L1, L2, L3, the significant current profile for this load circuit L1, L2, L3 is then derived, which ideally represents a static current behavior and a dynamic current behavior (for example, switch-on behavior) of the respective load circuit L1, L2, L3 during ongoing operation of the installation and/or the installation control system. Furthermore, from the recurring current pattern found for the respective load circuit L1, L2, L3 in the derivation step 102, a tolerance range belonging to the significant current profile is determined. The associated tolerance range results from a drift of, for example, current level, duration and/or shape of the recurring current pattern found in the respective current variation i1, i2, i3 for the respective load circuit L1, L2, L3. The respective tolerance range can possibly have a safety reserve applied to it.

In order to find the characteristic current pattern in the respective current variations i1, i2, i3, in the derivation step 102, preset data VD, such as current patterns frequently occurring in load circuits and/or current patterns that are typical for frequently used load units, can be used. The preset data VD is ideally ascertained in advance, for example, based on historical current variations of load circuits L1, L2, L3 and/or individual load units on the external computer unit PC and, for example, is transferred to the control unit SE and stored there in the storage unit SP.

In order to accelerate the finding of current patterns in the respective current variations i1, i2, i3 and/or for a derivation of the significant current profile of the respective load circuit L1, L2, L3 and the respectively associated tolerance range from the current variation i1, i2, i3 measured for the respective load circuit L1, L2, L3, a trained neural network can be used in the derivation step 102. The neural network has been trained before the learning phase with training data, such as typical and characteristic current patterns of load units frequently used in load circuits L1, L2, L3 on the external computer unit PC and then transferred to the control unit SE.

For the learning phase that comprises at least the measuring step 101 and the derivation step 102, for example, at least a minimum duration can be provided. Within this minimum duration, at least two characteristic current patterns for the respective load circuit L1, L2, L3 should be found in each measured current variation i1, i2, i3 in order to be able to derive at least one significant current profile with a rough tolerance range for the respective load circuit L1, L2, L3. After the specified minimum duration of the learning phase, a transfer into, for example, an ongoing operation of the installation can occur. In the maximum case, however, the learning phase can comprise the whole lifespan of the installation. Therein, the significant current profiles of the load circuits L1, L2, L3 and the associated tolerance range can also be adjusted and improved during the ongoing operation. Therein, for example, incidences of slightly exceeding and/or undershooting the tolerance range of a current profile can lead to an adjustment of the respective significant current profile. Relatively large or massive incidences of exceeding and/or undershooting the tolerance range that are established, for example, based on preset percentage values for the exceeding and/or undershooting can be evaluated, for example, as faults in the respective load circuit L1, L2, L3 and can result, for example, in an alarm or a notification to a user of the installation.

During the ongoing operation of the installation, in a monitoring step 103, the current variation i1, i2, i3 of each load circuit L1, L2, L3 presently being measured by the respective measuring unit ME1, ME2, ME3 is then continuously monitored by the control unit SE. Therein, it can, for example, the control unit SE can check whether an upper limit of the tolerance range of the significant current profile associated with the respective load circuit L1, L2, L3 is exceeded by the current variation i1, i2, i3 presently being measured for the respective load circuit L1, L2, L3. If such an instance of exceeding is ascertained, then, for example, a status marking can be assigned to the respective load circuit L1, L2, L3, which for example, remains in place until the control unit SE ascertain that the current variation i1, i2, i3 presently being measured for the respective load circuit L1, L2, L3 again lies within the tolerance range of the significant current profile associated with the respective load circuit L1, L2, L3. Alternatively or additionally, an alarm message can also be output by the control unit SE for each load circuit L1, L2, L3, in which the upper limit of the tolerance range of the significant current profile associated with the respective load circuit L1, L2, L3 is exceeded by the current variation i1, i2, i3 presently being measured for the respective load circuit L1, L2, L3.

Furthermore, in a checking step 104 that occurs more or less or substantially in parallel with the monitoring step 103, it is checked by the control unit SE whether the clocked power supply unit NG has already reached or already exceeded its power capacity limit. In order to recognize a reaching and possibly an exceeding of the power capacity limit by the power supply unit NG in the checking step 104, the control unit can, for example, monitor the output voltage $U_A$ of the power supply unit NG. If a preset limit value is exceeded by the output voltage $U_A$ of the power supply unit NG, then the power supply unit NG has at least reached its power capacity limit. That means the power supply unit NG can no longer maintain its preset output voltage $U_A$ given a prevailing current load due to the load circuits L1, L2, L3 and the control unit SE begins in a control step 105 at least to reduce and/or to switch off the current consumed in the load circuits L1, L2, L3.

As an alternative to the output voltage $U_A$ of the power supply unit NG, a total of all the prevailing current measurement values of the currents consumed by the load circuits L1, L2, L3 can be monitored by the control unit SE. For this purpose, for example, the prevailing current variations i1, i2, i3 of the load circuits L1, L2, L3 measured by the measuring units ME1, ME2, ME3 are evaluated by the control unit SE and therefrom, a prevailing sum value of the corresponding current measurement values is determined. This sum value is then compared with a preset limit value, for instance, a known power reserve of the power supply unit NG. If the sum value exceeds this preset limit value, then the control unit SE recognizes therefrom that the power supply unit NG has at least reached its power capacity limit and in the control step 105 begins at least to reduce and/or to switch off the current consumed in the load circuits L1, L2, L3.

However, a short timespan can be preset (for example, 5 ms), within which the power supply unit NG can exceed the power capacity limit at least slightly. The power supply unit NG then briefly supplies an overcurrent, which extends beyond the starting current $I_A$ normally supplied as the continuous current as the output current $I_A$. If, however, this preset timespan is exceeded, then the power capacity limit of the power supply unit NG has at least been reached and the control unit SE must begin with the control step 105 in order at least to reduce and/or to switch off the current consumed in the load circuits L1, L2, L3.

Alternatively, for example, the control unit SE can derive from the current profiles that are individually associated with the load circuits L1, L2, L3 how long, for example, an overcurrent (for example, switch-on current) will last before the control unit SE begins in the control step 105 to reduce the current in one or more load circuits L1, L2, L3. The control unit SE can compare an excess current consumption resulting therefrom with the time-limited overcurrent capacity of the power supply unit NG. If the result of this comparison is that the power supply unit NG can supply the necessary overcurrent for the expected duration (i.e., for example, only slightly exceeding the power limit), then firstly, for example, no intervention is made in the supply to the load circuits L1, L2, L3. A reduction and/or switching-off of the current in the load circuits L1, L2, L3 only takes place, for example, if it is apparent that the significant current profile is not sustained.

Furthermore, the power supply unit NG can also continuously transfer to the control unit SE prevailing capacity utilization values AW that represent, for example, in the form of parameters, a prevailing situation, such as an internal thermal situation (for example, a temperature and/or heating level) and/or input voltage variations (for example, voltage peaks, network disturbances and/or phase dropout) in the power supply unit NG. Based on the prevailing capacity usage values AW of the power supply unit NG, the control unit SE can recognize the prevailing power capacity of the power supply unit NG and, for example, calculate in advance whether and when, for example, for the sake of self-protection, the power supply unit NG must regulate its output voltage $U_A$ down or at least reaches its power capacity limit.

If the power capacity limit is at least reached or exceeded by the power supply unit NG, then in the control step 105, the control unit SE begins at least to reduce and/or to switch off the current consumed in those load circuits L1, L2, L3 in which an upper limit of the tolerance range of the significant current profile associated with the respective load circuit L1, L2, L3 is exceeded by the current variation i1, i2, i3 presently being measured for the respective load circuit L1, L2, L3. Therein, the respective switch units S1, S2, S3 of these load circuits L1, L2, L3 are actuated by the control unit SE with control signals AS1, AS2, AS3 in order to reduce and/or switch off the current in the respective load circuit L1, L2, L3.

For a reduction of the current consumed by the respective load circuit L1, L2, L3, the corresponding switch unit S1, S2, S3 can be actuated, for example, by a corresponding control signal AS1, AS2, AS3 such that the current consumed by the respective load circuit (L1, L2, L3) is time-limited. The switch unit S1, S2, S3 can, however, be placed into a clocked operation via a corresponding control signal AS1, AS2, AS3, via which it is held, for example, at a constant value. If the power supply unit NG cannot be made to undershoot the power capacity limit by reducing the current in the tolerance-exceeding load circuits L1, L2, L3, i.e., the load circuits L1, L2, L3 in which the upper limit of the tolerance range of the significant current profile associated with the respective load circuit L1, L2, L3 is exceeded by the prevailing current variation i1, i2, i3, then individual ones or all of the tolerance-exceeding load circuits L1, L2, L3 can also be switched off via corresponding control signals AS1, AS2, AS3 from the control unit SE to the respective switch units S1, S2, S3.

In order to be able to determine the tolerance-exceeding load circuits L1, L2, L3 rapidly, in the control step 105, the control unit SE can access the status markings from the monitoring step 103. Status markings have been assigned in the monitoring step 103 to those load circuits L1, L2, L3 in which the upper limit of the tolerance range of the significant current profile associated with the respective load circuit L1, L2, L3 has been exceeded by the current variation i1, i2, i3 presently being measured in the monitoring step 103.

A sequence can also be specified to the control unit SE in the control step 105, according to which the current in the tolerance-exceeding load circuits L1, L2, L3 is reduced and/or according to which tolerance-exceeding load circuits L1, L2, L3 are switched off. With this specified sequence it can, for example, be predetermined that firstly, a current reduction and/or a current switch-off is undertaken in those load circuits L1, L2, L3 that most severely overshoot the respective upper limit of the tolerance range of the respectively assigned significant current profile. That is, the current in the tolerance-exceeding load circuits L1, L2, L3 that most heavily load the power supply unit NG and/or consume the most current or are most likely to have a defect is reduced and/or switched off first.

Furthermore, the possibility also exists in further (not tolerance-exceeding) load circuits L1, L2, L3 of reducing and/or switching off the current consumed by each load circuit L1, L2, L3 if, for example, the current reduction and/or switch-offs in the tolerance-exceeding load circuits is insufficient to restore the power capacity of the power supply unit NG. The switching off of the respectively consumed current in the load circuits L1, L2, L3 can therein occur, for example, according to a previously specified prioritization of the load circuits, so that, for example, important load circuits L1, L2, L3 and/or important load units (for example control units, etc.) connected thereto are supplied with energy as far as possible and remain available on an enduring basis.

Thus, while there have been shown, described and pointed out fundamental novel features of the invention as applied to a preferred embodiment thereof, it will be understood that various omissions and substitutions and changes in the form and details of the methods described, and in their operation, may be made by those skilled in the art without departing from the spirit of the invention. For example, it is expressly intended that all combinations of those method steps that perform substantially the same function in substantially the same way to achieve the same results are within the scope of the invention. Moreover, it should be recognized that method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for monitoring and controlling current distribution in load circuits of an installation control system of a technical installation, a predetermined output voltage being made available by at least one clocked power supply unit and distributed for an energy supply to the load circuits, and at least a plurality of the load circuits being protected by a respective switch unit which are each actuated by a control unit, the method comprising:
    measuring, by a respective measuring unit during a learning phase, at least in the load circuits which are protected with the respective switch unit, a current variation of current consumed by each respective load circuit;
    deriving and associating at least a significant current profile and an associated tolerance range with each respective load circuit from the current variation measured for each respective load circuit;
    continuously monitoring, by the control unit, a current variation which is presently being measured, by the respective measuring unit, at least in the load circuits which are being protected by the respective switch unit during an ongoing operation of the installation;
    performing a check to determine whether a power capacity limit is at least reached by the at least one clocked power supply unit; and
    reducing and/or switching off current consumed by each load circuit by the control unit by actuating the respective switch unit in those load circuits in which an upper limit of the tolerance range of the significant current profile associated with a respective load circuit is exceeded by a current variation presently being measured for the respective load circuit if the power capacity limit is at least reached by the at least one clocked power supply unit.

2. The method as claimed in claim 1, wherein one of the output voltage of the clocked power supply unit and a sum of prevailing current measurement values of the respective currents consumed by the load circuits is monitored by the control unit to recognize when the power capacity limit of the clocked power supply unit is reached.

3. The method as claimed in claim 1, wherein a timespan is predetermined during which the power capacity limit of the clocked power supply unit can be exceeded by a predetermined amount.

4. The method as claimed in claim 2, wherein a timespan is predetermined during which the power capacity limit of the clocked power supply unit can be exceeded by a predetermined amount.

5. The method as claimed in claim 1, wherein prevailing capacity utilization values or reaching and/or exceeding the power capacity limit are continuously transferred from the clocked power supply unit to the control unit to recognize when the power capacity limit of the clocked power supply unit is reached.

6. The method as claimed in claim 1, further comprising:
    specifying a sequence to the control unit for at least one of a reduction and a switching-off of the current in those load circuits in which the upper limit of the tolerance range of the significant current profile associated with the respective load circuit is exceeded by the current variation presently being measured for the respective load circuit.

7. The method as claimed in claim 1, wherein a status marking is assigned to those load circuits in which the upper limit of the tolerance range of the significant current profile associated with the respective load circuit is exceeded, during ongoing operation of the installation, by the current variation presently being measured for the respective load circuit.

8. The method as claimed in claim 7, wherein upon reaching the power capacity limit by the clocked power supply unit, the status marking which is currently assigned to the respective load circuit is utilized by the control unit.

9. The method as claimed in claim 1, wherein an alarm message is output for those load circuits in which the upper limit of the tolerance range of the significant current profile associated with the respective load circuit is exceeded, during ongoing operation of the installation, by the current variation presently being measured for the respective load circuit.

10. The method as claimed in claim 1, wherein for the reduction of the current consumed by the respective load circuit, the switch unit of the respective load circuit is actuated by the control unit such that at least one of the current consumed by the respective load circuit is time-limited and the switch unit is switched into a clocked operation.

11. The method as claimed in claim 1, wherein the significant current profile of the respective load circuit is derived in the learning phase based on preset data from the current variation measured for the respective load circuit.

12. The method as claimed in claim 1, wherein a trained neural network is utilized for a derivation of the significant current profile of the respective load circuit.

13. The method as claimed in claim 1, wherein a minimum duration is specified for the learning phase.

14. The method as claimed in claim 1, wherein a safety limit value is defined for each load circuit protected with a switch unit, upon which at least one of reaching and/or exceeding the current consumed by the respective load circuit is always switched off.

15. The method as claimed in claim 1, wherein an additional protection apparatus is provided in the load circuits.

16. The method as claimed in claim 1, wherein the switch unit comprises one of a power transistor and a microelectromechanical system (MEM).

* * * * *